(12) United States Patent  
Williams

(10) Patent No.: US 7,056,131 B1  
(45) Date of Patent: Jun. 6, 2006

(54) CONTACT GRID ARRAY SYSTEM

(75) Inventor: John D. Williams, Campbell, CA (US)

(73) Assignee: Neoconix, Inc., Sunnyvale, CA (US)

( * ) Notice: Subject to any disclaimer, the term of this patent is extended or adjusted under 35 U.S.C. 154(b) by 0 days.

(21) Appl. No.: 10/412,729

(22) Filed: Apr. 11, 2003

(51) Int. Cl.
*H01R 12/00* (2006.01)

(52) U.S. Cl. .......................................... 439/74; 439/66
(58) Field of Classification Search ................. 439/74, 439/60, 71, 66
See application file for complete search history.

(56) References Cited

U.S. PATENT DOCUMENTS

| | | | |
|---|---|---|---|
| 3,543,587 A | 12/1970 | Kawada | |
| 3,634,807 A | 1/1972 | Grobe et al. | |
| 3,670,409 A | 6/1972 | Reimer | |
| 4,893,172 A * | 1/1990 | Matsumoto et al. | ........ 174/254 |
| 4,998,885 A | 3/1991 | Beaman | |
| 5,152,695 A | 10/1992 | Grabbe et al. | |
| 5,173,055 A | 12/1992 | Grabbe | |
| 5,199,879 A | 4/1993 | Kohn et al. | |
| 5,228,861 A | 7/1993 | Grabbe | |
| 5,257,950 A | 11/1993 | Lenker et al. | |
| 5,292,558 A | 3/1994 | Heller et al. | |
| 5,358,411 A | 10/1994 | Mroczkowski et al. | |
| 5,366,380 A | 11/1994 | Reymond | |
| 5,468,655 A | 11/1995 | Greer | |
| 5,483,741 A | 1/1996 | Akram et al. | |
| 5,530,288 A | 6/1996 | Stone | |
| 5,532,612 A | 7/1996 | Liang | |
| 5,590,460 A | 1/1997 | DiStefano et al. | |
| 5,593,903 A | 1/1997 | Beckenbaugh et al. | |
| 5,629,837 A | 5/1997 | Barabi et al. | |
| 5,632,631 A | 5/1997 | Fjelstad et al. | |
| 5,772,451 A | 6/1998 | Dozier et al. | |
| 5,791,911 A | 8/1998 | Fasano et al. | |
| 5,802,699 A * | 9/1998 | Fjelstad et al. | ................ 29/593 |
| 5,812,378 A * | 9/1998 | Fjelstad et al. | ............. 361/769 |
| 5,842,273 A | 12/1998 | Schar | |
| 5,860,585 A | 1/1999 | Rutledge et al. | |
| 5,896,038 A | 4/1999 | Budnaitis et al. | |
| 5,934,914 A | 8/1999 | Fjelstad et al. | |
| 5,967,797 A | 10/1999 | Maldonado | |
| 5,980,335 A | 11/1999 | Barbieri et al. | |
| 5,989,994 A | 11/1999 | Khoury et al. | |
| 6,019,611 A | 2/2000 | McHugh et al. | |
| 6,031,282 A | 2/2000 | Jones et al. | |
| 6,032,356 A | 3/2000 | Eldridge et al. | |
| 6,042,387 A * | 3/2000 | Jonaidi | ........................ 439/66 |

(Continued)

FOREIGN PATENT DOCUMENTS

EP  0692823 A1  1/1996

(Continued)

OTHER PUBLICATIONS

An article entitled "Patented Socketing System for the BGA/CSP Technology" by E-tec Interconnect Ltd., pp. 1-4.

(Continued)

*Primary Examiner*—Ross Gushi
(74) *Attorney, Agent, or Firm*—Michael, Bednarek, Pillsbury Winthrop Shaw Pittman LLP

(57) ABSTRACT

A scalable, low cost, reliable, compliant, low profile, low insertion force, high-density, separable and reconnectable electrical connection for high speed, high performance electronic circuitry and semiconductors. The electrical connection can be used to make, for example, electrical connections from one Printed Circuit Board (PCB) to another PCB, MPU, NPU, or other semiconductor device.

11 Claims, 11 Drawing Sheets

U.S. PATENT DOCUMENTS

| | | | |
|---|---|---|---|
| 6,063,640 A | 5/2000 | Mizukoshi et al. | |
| 6,083,837 A | 7/2000 | Millet | |
| 6,133,534 A | 10/2000 | Fukutomi et al. | |
| 6,146,151 A | 11/2000 | Li | |
| 6,156,484 A | 12/2000 | Bassous et al. | |
| 6,184,699 B1 | 2/2001 | Smith et al. | |
| 6,196,852 B1* | 3/2001 | Neumann et al. | 439/66 |
| 6,200,143 B1* | 3/2001 | Haba et al. | 439/70 |
| 6,204,065 B1 | 3/2001 | Ochiai | |
| 6,205,660 B1 | 3/2001 | Fjelstad et al. | |
| 6,208,157 B1 | 3/2001 | Akram et al. | |
| 6,221,750 B1 | 4/2001 | Fjelstad | |
| 6,224,392 B1 | 5/2001 | Fasano et al. | |
| 6,250,933 B1 | 6/2001 | Khoury et al. | |
| 6,255,727 B1 | 7/2001 | Khoury | |
| 6,264,477 B1 | 7/2001 | Smith et al. | |
| 6,293,806 B1 | 9/2001 | Yu | |
| 6,293,808 B1 | 9/2001 | Ochiai | |
| 6,297,164 B1 | 10/2001 | Khoury et al. | |
| 6,298,552 B1 | 10/2001 | Li | |
| 6,306,752 B1 | 10/2001 | DiStefano et al. | |
| 6,335,210 B1 | 1/2002 | Farooq et al. | |
| 6,336,269 B1 | 1/2002 | Eldridge et al. | |
| 6,337,575 B1 | 1/2002 | Akram | |
| 6,361,328 B1 | 3/2002 | Gosselin | |
| 6,373,267 B1 | 4/2002 | Hiroi | |
| 6,374,487 B1 | 4/2002 | Haba et al. | |
| 6,392,524 B1 | 5/2002 | Biegelsen et al. | |
| 6,392,534 B1 | 5/2002 | Flick | |
| 6,399,900 B1 | 6/2002 | Khoury et al. | |
| 6,402,526 B1 | 6/2002 | Schreiber et al. | |
| 6,420,661 B1 | 7/2002 | Di Stefano et al. | |
| 6,420,789 B1 | 7/2002 | Tay et al. | |
| 6,420,884 B1 | 7/2002 | Khoury et al. | |
| 6,428,328 B1 | 8/2002 | Haba et al. | |
| 6,436,802 B1 | 8/2002 | Khoury | |
| 6,437,591 B1 | 8/2002 | Farnworth et al. | |
| 6,442,039 B1 | 8/2002 | Schreiber | |
| 6,452,407 B1 | 9/2002 | Khoury et al. | |
| 6,461,892 B1 | 10/2002 | Beroz | |
| 6,472,890 B1 | 10/2002 | Khoury et al. | |
| 6,474,997 B1 | 11/2002 | Ochiai | |
| 6,492,251 B1 | 12/2002 | Haba et al. | |
| 6,517,362 B1* | 2/2003 | Hirai et al. | 439/82 |
| 6,520,778 B1 | 2/2003 | Eldridge et al. | |
| 6,524,115 B1 | 2/2003 | Gates et al. | |
| 6,551,112 B1 | 4/2003 | Li et al. | |
| 6,576,485 B1 | 6/2003 | Zhou et al. | |
| 6,604,950 B1 | 8/2003 | Maldonado et al. | |
| 6,612,861 B1 | 9/2003 | Khoury et al. | |
| 6,616,966 B1 | 9/2003 | Mathieu et al. | |
| 6,622,380 B1 | 9/2003 | Grigg | |
| 6,627,092 B1* | 9/2003 | Clements et al. | 216/13 |
| 6,640,432 B1 | 11/2003 | Mathieu et al. | |
| 6,661,247 B1* | 12/2003 | Maruyama et al. | 324/765 |
| 6,664,131 B1* | 12/2003 | Jackson | 438/108 |
| 6,671,947 B1 | 1/2004 | Bohr | |
| 6,677,245 B1 | 1/2004 | Zhou et al. | |
| 6,700,072 B1 | 3/2004 | DiStefano et al. | |
| 6,719,569 B1 | 4/2004 | Ochiai | |
| 6,730,134 B1 | 5/2004 | Neidich | |
| 6,736,665 B1 | 5/2004 | Zhou et al. | |
| 6,750,136 B1 | 6/2004 | Zhou et al. | |
| 6,791,171 B1 | 9/2004 | Mok et al. | |
| 6,815,961 B1 | 11/2004 | Mok et al. | |
| 6,847,101 B1 | 1/2005 | Fjelstad et al. | |
| 6,848,173 B1 | 2/2005 | Fjelstad et al. | |
| 2002/0011859 A1 | 1/2002 | Smith et al. | |
| 2002/0055282 A1 | 5/2002 | Eldridge et al. | |
| 2002/0058356 A1 | 5/2002 | Oya | |
| 2002/0079120 A1 | 6/2002 | Eskildsen et al. | |
| 2002/0129894 A1 | 9/2002 | Liu et al. | |
| 2002/0133941 A1 | 9/2002 | Akram et al. | |
| 2002/0146919 A1 | 10/2002 | Cohn | |
| 2002/0179331 A1 | 12/2002 | Brodsky et al. | |
| 2003/0035277 A1 | 2/2003 | Saputro et al. | |
| 2003/0089936 A1 | 5/2003 | McCormack et al. | |
| 2003/0096512 A1 | 5/2003 | Cornell | |
| 2003/0099097 A1 | 5/2003 | Mok et al. | |
| 2003/0129866 A1 | 7/2003 | Romano et al. | |
| 2003/0147197 A1 | 8/2003 | Uriu et al. | |
| 2003/0194832 A1 | 10/2003 | Lopata et al. | |

FOREIGN PATENT DOCUMENTS

| | | |
|---|---|---|
| EP | 1208241 | 1/2003 |
| JP | 2000011443 | 4/2000 |
| JP | 2001203435 | 7/2001 |
| WO | 9602068 | 1/1996 |
| WO | 9744859 | 11/1997 |
| WO | 0213253 | 2/2002 |

OTHER PUBLICATIONS

Gary B. Kromann et al., "Motorola's PowerPC 603 and PowerPC 604 RISC Microprocessor: the C4/Ceramic-ball-grid Array Interconnect Technology", Motorola Advanced Packaging Technology, Motorola, Inc., 1996, pp. 1-10.

Ravi Mahajan et al., "Emerging Directions for Packaging Technologies", Intel Technology Journal, V. 6, Issue 02, May 16, 2002, pp. 62-75.

* cited by examiner

PCB 20

CONTACT GRID ARRAY SYSTEM

FIELD OF THE INVENTION

The invention pertains to separable electronic contact systems and, more particularly, to a separable electronic contact grid array system having exceptional elasticity and low inductance properties, and which is elastically and electrically functional across the entire gap separating the electronic devices to be connected.

BACKGROUND OF THE INVENTION

The ability to make separable electrical contact with contacts of miniature electronic circuits has become more problematic as the mechanical, electrical, and reliability requirements of these electrical contacts become more demanding. Nano springs, pogo pins, micro springs, and other miniature contact devices have been developed to deal with the problem of making reliable electrical contact between a microcircuit and the rest of an electronic system. The problem for the industry, however, is that no particular contact design appears to provide all of the properties required, even where specially designed contact elements are used in specific applications. None of the existing contacts can meet all of the design criteria.

It is desirable to have separable electrical connections in electronic applications because these connections are used in system assembly, device testing, and wafer probing.

As frequencies, densities, and the number of connections increase for a packaged electrical device, existing electrical connector technologies do not function effectively. This occurs as frequencies increase above ~1 GHz, densities increase to a contact-to-contact spacing (pitch) of 1 mm or less, and the number of connections increases to 600 or more. The malfunctioning of the connecting system effectively means that large clamping forces, on the order of 50 g/contact or higher, are often required. Also, these poorly performing contact systems show poor signal integrity (noise more than 3 dB or >~0.5 nH self inductance), or DC poor contact resistance (>15 mOhms).

Other common problems associated with the existing contact technologies are: (i) the inability to scale to high density, (ii) the inability to address large pin counts, (iii) the inability to address low profile requirements or unique form factors, (iv) high cost, (v) inadequate reliability, (vi) poor mechanical compliance to surface under contact while maintaining good electrical performance, (vii) high insertion force required to make good electrical contact, (viii) high inductance, and (ix) poor signal integrity at high frequencies.

Existing technologies can address some of the problems for some market requirements, but they cannot address all of the aforementioned problems, even for specific applications.

The trend in electronics has been to increase backend circuit density and performance in order to realize a correlation to Moore's Law, which states that semiconductor density or performance doubles nearly every 18 months. This push to emulate Moore's Law drives the design of electrical contact elements that are optimized mechanically, thermally, and electrically for use in high-speed electronic systems. The contact elements may be used to attach a microprocessor for a computer, a telecommunications NPU network device, or a host of other electronic devices that are possible in the electronics industry.

Optimizing mechanical and electrical properties of the contact elements is also required to enable highly reliable and reproducible semiconductor testing results. This is essential for preventing potential early device or product failure. To be competitive, companies have had to optimize their devices on a cost/performance basis. However, this type of optimizing leads to inefficiencies and additional costs for thoroughly testing the devices. Neglecting a thorough testing of the devices, however, may lead to early field failure at the customer site. This dichotomy is very problematical for the manufacturer.

In some cases, such as for silicon-wafer probing and mobile applications, it is also very important that: (a) the interconnections be scalable to high densities, (b) that the contacts use the least possible amount of real estate on the printed circuit board, and (c) that they provide minimal impact on the printed circuit board wiring.

In some cases, such as for laptop computers, handheld devices, and high-frequency applications, it is very important that the height of the connectors and the auxiliary circuit members be as low as possible.

As aforementioned, new requirements relating to system performance have increased dramatically as circuits have continued to shrink in size and improve performance. This has impacted the stringent specifications for interconnections in these systems. For example, signal integrity requirements have become extremely demanding. Signal integrity can be improved by designing the interconnections to match the electrical impedance of the system, thus minimizing electrical reflections.

The need for improved electrical performance using separable and reconnectable electrical contact elements has led to a wide variety of connector solutions in the marketplace. These solutions cause pressure upon the industry to assure effective repair, upgrade, and/or replacement of various components of the system (e.g., connectors, cards, chips, boards, modules, etc.).

It is desirable to have a connector element, designed to provide a demountable connection that would provide good performance (<0.5 nH self inductance, <3 dB noise, <50 g contact force, <15 mOhms contact resistance) for frequencies above ~1 GHz and a pitch ~1 mm or less for an array of ~600 contacts or greater.

The present invention comprises an electrical contact structure in which the elastic working range approaches or exceeds the electrical contact distance and the pitch and height are both equal to or less than 1 mm. This contact structure provides the desired performance under the constraints of high-end applications as described above.

The reason that the working range needs to be on the order of the contact length is that surfaces of the structures being connected are never perfectly flat. As the required height and pitch of the connections decreases to 1 mm or less and the number of electrical contacts in a connector array increases to about 600 contacts or more, the inherent non-flatness of the structures that are being connected prevents good electrical connection from being made unless the working range is on the order of the electrical contact distance.

It would therefore be desirable to have a contact system that can meet the many requirements for miniature contacts for both special and across-the-board applications, and have an elastic and electrical functionality across the gap between the electrical members to be connected.

It is also highly desirable in some cases that, within the final product, such connections be separable and reconnectable in the field. Such a capability is also desirable during manufacture to facilitate testing and manufacturing rework, for example.

The present invention features a new contact system that meets all, or most of, the aforementioned requirements. The elasticity and flexibility of the contacts of the present system exceed anything currently in the marketplace. The range of flexibility is such that the contacts can be deflected across the full gap between the electrical devices being connected and beyond, i.e., the contacts are movable across the full substrate (interposer) thickness. To the best of knowledge and belief, no other contact system has this capability.

The current invention is based on the discovery that a reliable contact system first needs to be designed with a contact elasticity within a given range without sacrificing electrical properties, and as a corollary to this requirement, the contacts must be engineered within a given size range for the elasticity chosen.

The present invention provides a scalable, low cost, reliable, compliant, low profile, low insertion force, high density, separable/reconnectable electrical connection for high speed, high performance semiconductors and electronic circuitry. The invention can be used, for example, to make electrical connections from a Printed Circuit Board (PCB) to another PCB, MPU, NPU, or other semiconductor device. The invention comprises, but is not limited to, a beam land grid array (BLGA) or a ball beam grid array (BBGA) system. The electrical and mechanical functionality of the BLGA and/or BBGA system lends itself to numerous applications in electronic space. This is particularly so where scalable, low cost, reliable, compliant, low profile, low insertion force electrical contacts are required.

Together, these two systems provide a good signal integrity electronic test contact element for high speed, high performance applications. Short interconnections are made possible between almost any electrical contact surfaces of the system, while maintaining high electrical performance. Some suitable applications include test, burn-in, prototyping, and full wafer burn-in applications that require high electrical performance. Optimized electrical, thermal, and mechanical properties have been realized.

Both the BBGA and the BLGA systems offer inductive and elasticity advantages over stamped metal springs and coiled springs. Low inductance is important for signal integrity at high frequencies. In general, shorter contact elements give lower inductance but less elastic working range. This is not the case with the BLGA and BBGA systems. The lowest inductance pogo pins in the market are 0.4 nH and they are very expensive. All the current approaches are reaching fundamental limitations in reducing the inductance because they become too hard to manufacture (e.g., pogo pins), or too stiff (e.g., stamped metal springs). These and other like systems cannot operate with the correct geometry to allow for low inductance. By contrast, the contact array system of the present invention can flex across the entire gap separating the electrical devices to be connected.

The number of I/O(s) on high-end packages is several thousand and increasing. This strains the requirement for low contact force. At present, high performance production sockets with 1,000 or more I/O require the application of several hundred pounds of force, in order to make an effective connection with an LGA socket. As the I/O count increases, these systems cannot be assembled in the field due to the required high force.

In addition, the power in many systems continues to increase. This in turn strains the thermal requirement. More heat must be removed from the silicon die, which causes the manufacturers to directly clamp a heat sink onto the top of the silicon die. In some cases, this is done with no cap on the package for protection. A small contact force is necessary for electrical connection to prevent damaging the device, using a thin cap or cap-free design that enhances thermal conduction.

The invention provides a very low contact force solution. In test sockets, a lower contact force enables a less expensive handling system. Both the BBGA and the BLGA systems offer many advantages over other conventional connector technologies, one of which is a contact wiping force having both horizontal and vertical force components.

Typical LGA contact elements need to operate over a range of compression distances. The extended range accommodates variations in system co-planarity, and can accommodate a less flat system. This significantly reduces cost for the overall design because it allows for a less expensive clamping solution and relaxed specifications on the two interfaces being connected. A larger elastic working range is also correlated to better connector reliability.

The spacing between contact elements has to be scaled down with respect to the package I/O pitch. Current technologies, such as stamped springs and injection-molded approaches, are fundamentally limited in how closely they can be spaced during manufacture. Stamped springs need room to be inserted, and injection-molded parts need space for the mechanical integrity of the mold. The present contact array system has no such limitations. By contrast, the inventive contact system is functional across the entire gap of separation between the devices to be connected, i.e., it spans the thickness of the substrate.

DISCUSSION OF RELATED ART

There are many similar contact systems in the art, but this invention is unique for providing a high-density array of highly elastic contacts that operate over more than 0.2 mm with an approximate low resistance and inductance of less than fifteen m$\Omega$, and less than 0.5 nH, respectively. The contact system of this invention is also unique in this field because instead of requiring a large force to bring the contact-to-contact elements together, the inventive array of contacts forms an interposer, which is clamped in place with a force of approximately less than thirty grams.

The contact-to-contact gap between devices that are connected can be defined by the intermediate substrate or interposer thickness. Other, present day contact systems use part of this gap width to structure or house their contacts, i.e., the contacts themselves consume part of this space. The present contact system of this invention is structured to be elastically and electrically functional across the entire gap between electrical devices that are to be connected. To the best of knowledge and belief, no other contact system has such capability.

As an example, pogo pins and stamped metal springs have a pitch and height scale below 1 mm. These contact systems have a ratio of the elastic working range to the electrical contact distance of much less than 1.

In U.S. Pat. No. 5,199,879, issued to Kohn et al. on Apr. 6, 1993 for ELECTRICAL ASSEMBLY WITH FLEXIBLE CIRCUIT, a permanent assembly technique is shown in which metal flanges are used to capture a pin in a hole in a printed circuit board. These metal flanges make electrical contact between the pins from one circuit board or device and the traces on another circuit board. This requires the pin to be inserted fully and permanently into the hole and describes an electrical connection from the pin to horizontal traces in the receiving printed circuit board.

In U.S. Pat. No. 6,250,933 B1, issued to Khoury et al. on Jun. 26, 2001 for CONTACT STRUCTURE AND PRODUCTION METHOD THEREOF, a microfabrication process is disclosed for making bridge-like structures on one side of a semiconductor substrate or other dielectric surfaces. These structures are designed for making temporary electrical contact between a contact target and horizontal electrical traces on the semiconductor or dielectric substrate.

In a companion patent to Khoury et al., U.S. Pat. No. 6,420,884 B1, issued on Jul. 16, 2002 for CONTACT STRUCTURE FORMED BY PHOTOLITHOGRAPHY PROCESS, there is also disclosed a microfabrication technique for making beams on a silicon substrate for temporary electrical contact between a contact target and a silicon substrate. The horizontal traces can be connected to the opposite side of the substrate through a via hole. The microfabrication techniques disclosed by Khoury et al. have inherent and practical limitations with respect to the ratio of the elastic working range to the electrical contact distance, which is much less than 1.

In U.S. Pat. No. 6,208,157 B1, issued to Akram et al. on Mar. 27, 2001 for METHOD FOR TESTING SEMICONDUCTOR COMPONENTS, a method of testing semiconductor components in which shaped contact members are configured to align and provide coming members to make temporary electrical contact to the circuitry substrate is illustrated. Similarly, a companion patent to Akram et al., U.S. Pat. No. 6,337,575 B1, issued on Jan. 8, 2002 for METHODS OF TESTING INTEGRATED CIRCUITRY, METHODS OF FORMING TESTER SUBSTRATES, AND CIRCUITRY TESTING SUBSTRATES, discloses a method of testing integrated circuitry in which the circuitry substrate to be tested has a plurality of exposed conductors in electrical connection with the integrated circuitry, and in which at least some of the exposed conductors are heated to greater than 125 degrees Celsius.

Similary, another Akram et al. patent, U.S. Document No. 2002/0133941 A1, having the disclosure date of Sep. 26, 2002, teaches a socket that is used to house a semiconductor die during testing in which a recessed socket contact is provided. The recessed socket avoids pinching the die's contacts. In all three of these disclosures, the temporary contact has an elastic working range to electrical contact distance ratio of much less than 1.

In U.S. Pat. No. 6,373,267 B1, issued to Hiroi on Apr. 16, 2002 for BALL GRID ARRAY-INTEGRATED CIRCUIT TESTING DEVICE, a measuring mechanism is disclosed for a BGA-IC in which a conical contact surface in a BGA contact seat is used to make the contact to a solder ball of a BGA-IC. The BGA contact seat is connected to a tester. In this disclosure, the temporary contact has an elastic working range to electrical contact distance ratio of much less than 1.

In U.S. Pat. No. 6,200,143 B1, issued to Haba et al. on Mar. 13, 2001 for LOW INSERTION FORCE CONNECTOR FOR MICROELECTRONIC ELEMENTS, a connector for microelectronic elements is disclosed, which consists of a sheet-like dielectric layer having a plurality of through holes desirably arranged in a rectangular pattern, and in which there is at least one conductive projection extending inwardly over the through hole. Bump leads from the microelectronic element can be received in the through holes and make contact with the projection. The contact has a ratio of elastic working range to electrical contact distance of much less than 1.

SUMMARY OF THE INVENTION

In accordance with the present invention, there is provided a separable and reconnectable contact system for electronically connecting circuits, chips, boards, and packages together. The system is characterized by its elastic functionality across the entire gap of separation between the circuits, chips, boards, or packages being connected, i.e., across the thickness of the connection system. The invention comprises two embodiments: a beam land grid array (BLGA), and a beam ball grid array (BBGA). However, the invention is not limited to these particular structural designs.

Each system comprises two primarily parallel circuit elements to be connected. The systems each have a plurality of contact points arranged in a linear or two-dimensional array. An array of interconnection elements, known as an interposer, is placed between the two boards, devices, or substrates to be connected, and provides the electrical connection between the contact points or pads.

For even higher density interconnections, additional parallel circuit elements may be stacked and electrically connected through additional BLGA connectors to create a three-dimensional package. A retentive force is not inherent, as with pin-and-socket-type interconnections, but a clamping mechanism is needed to create the force necessary to ensure each contact member is compressed an appropriate amount during engagement. This is needed to form the required interconnections to the circuit elements. Thermal management structures and other electrical circuitry may be included within the structure to enhance overall system performance.

PCB techniques are used to fabricate the contacts and substrates of this invention. Typical mechanical and electrical characteristics for the contacts of this invention include a large working range greater than 5 mils, a low contact force less than 30 g, wiping action having both horizontal and vertical components for reliability, high durability greater than two hundred thousand cycles, high temperature operability greater than 125° C., good elasticity, low inductance less than 0.5 nH, high current capacity greater than 1.5 A, a small scalable pitch less than 20 mils, and a functional elasticity across the entire gap separating the two devices, boards, or substrates to be electrically connected.

The contact system of this invention is fabricated in accordance with the following method steps comprising:
 (a) forming a plurality, or an array of contact elements in a metal or conductive sheet by etching, stamping, and using traditional PCB methods; and
 (b) attaching the sheet of step (a) to a substrate that comprises an electrical contact from one side to an opposite side. This can comprise standard printed circuit board substrate material, such as FR4, for example. The substrate should generally comprise an insulating material having conductive elements therethrough.
 (c) A similar array of contact elements in a metal may also be attached to the opposite side of the sheet. Alternatively, solder balls or another standard contact approach may be used on one or both sides.
 (d) Unwanted metal can then be removed by etching, for example.
 (e) Having formed the contact sheet of this invention, the sheet is then placed between two circuits, chips, boards, packages, or devices to be electrically connected together, thus forming an interposer.
 (f) The interposer is then clamped between the two outer devices.

The contact system of this invention can also be fabricated in accordance with the following method steps, comprising:

(a) attaching a sheet of metal, or other conductive sheet, to a substrate that comprises an electrical contact from one side to an opposite side. This can comprise standard printed circuit board substrate material, such as FR4, for example. The substrate should generally comprise an insulating material having conductive elements therethrough; and forming a plurality or an array of contact elements in the metal or conductive sheet by etching, stamping, and using traditional PCB methods;

(b) forming a plurality, or an array of contact elements in the metal or conductive sheet by etching, stamping, and using traditional PCB methods;

(c) a similar array of contact elements in a metal may also be attached to the opposite side of the sheet. Alternatively, solder balls or another standard contact approach may be used on one or both sides;

(d) unwanted metal can then be removed, by etching, for example;

(e) having formed the contact sheet of this invention, the sheet is then placed between two circuits, chips, boards, packages, or devices to be electrically connected together in the form of an interposer; and (f) the interposer is then clamped between the two outer devices.

The aforementioned contact systems are based on the discovery that to provide a reliable contact system meeting a multitude of requirements, it is necessary for the contacts to operate within a given elastic range, without sacrificing electrical integrity. The contacts and substrates can be fabricated by printed circuit board techniques, as aforementioned, in order to achieve this range. A corollary to this requirement is that a given size range is mandated for the elasticity chosen for the contacts. There is a given ratio of elasticity-to-size.

The elasticity range for the invention is approximately between 0.12 mm and 0.4 mm. The size for the flange springs is between approximately 0.12 mm and 0.8 mm. Consequently, an "elasticity to size ratio" is in the approximate range of between 0.5 and 1.0.

It is therefore an object of the invention to provide a scalable, low cost, reliable, compliant, low profile, low insertion force, high density, electrically optimized contact element and contact system.

It is another object of the present invention to provide a contact system that has a wide range of electrical and mechanical properties.

It is yet another object of the invention to provide an improved array of contacts for use in attaching electronic circuits, PCBs, modules, and electronic packages.

BRIEF DESCRIPTION OF THE DRAWINGS

A complete understanding of the present invention may be obtained by reference to the accompanying drawings, when considered in conjunction with the subsequent detailed description, in which:

FIG. 1f illustrates plan views of the contact arm array shown in FIG. 1a;

FIGS. 5a and 5b illustrate enlarged top and side schematic views of the contact arms of FIG. 1a;

For purposes of brevity and clarity, like components and elements of the apparatus of this invention will bear the same designations or numbering throughout the figures.

DESCRIPTION OF THE PREFERRED EMBODIMENT

Generally speaking, the invention features a scalable, low cost, reliable, compliant, low profile, low insertion force, high-density, separable and reconnectable electrical connection for high speed, high performance electronic circuitry and semiconductors. The electrical connection can be used, for example, to make electrical connections from one PCB to another PCB, MPU, NPU, or other semiconductor device.

The invention comprises a connection system consisting of a beam land grid array (BLGA) or a ball beam grid array (BBGA). The electrical and mechanical functionality of the BLGA and/or BBGA lends itself to numerous applications in the electronics space. It allows for short interconnections to be established between almost any electrical contact surfaces, thus maintaining high electrical performance. Some suitable applications include test, burn-in, prototyping, and full wafer burn-in applications, which require high electrical performance. Optimized electrical, thermal, and mechanical properties are realized by the use of the BLGA or BBGA electrical contact elements.

Figure 1A:
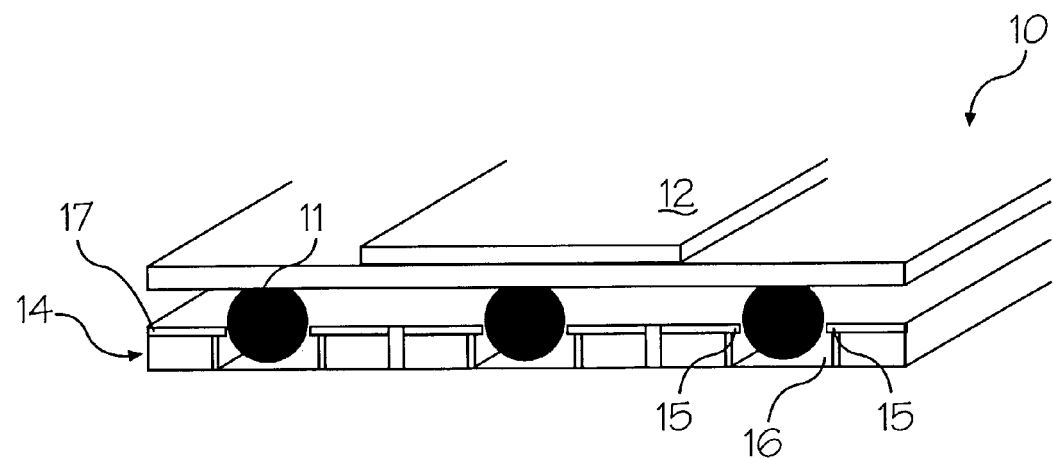
FIGS. 1a and 1b illustrate enlarged, perspective sectional views of a BBGA system of this invention and its attachment to a PCB.
Figure 1B:
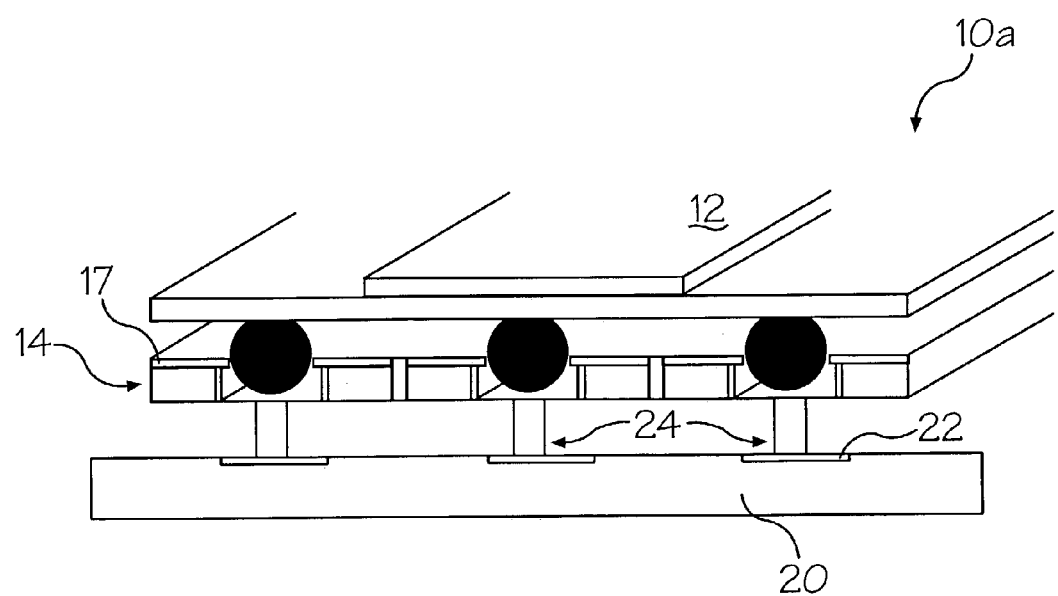

Now referring to FIGS. 1a and 1b, a sequenced construction of a cross-sectional schematic view of the BBGA system of this invention is illustrated by arrows 10 and 10a. In the first construction 10 illustrated in FIG. 1a, the solder balls 11 provide a method of good electrical contact between the device, packages, or module 12, and the carrier or loadboard 14. The solder balls 11 are shown disposed within the plated through holes (PTHs) or vias 16 that have been fabricated into the carrier or loadboard 14 by printed circuit techniques. The solder balls 11 are given elasticity by virtue of their suspension upon the flexible contact arms 15 formed as part of the layer 17. These contact arms 15 cradle the solder ball 11, as observed in FIG. 1e, and provide a spring-like support, as can also be observed with reference to FIGS. 1c, and 1d.

Figure 1C:
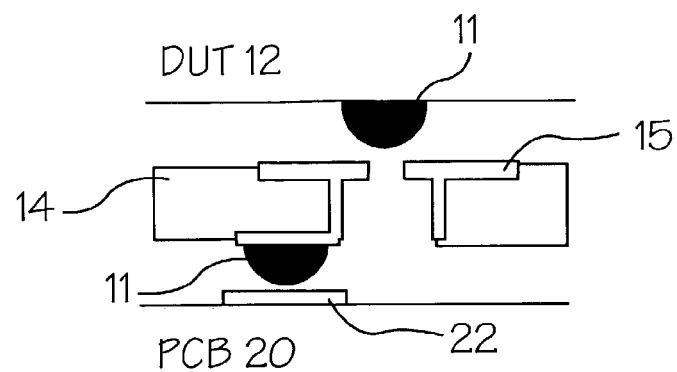
FIGS. 1c and 1d depict sectional views of two respective contact schemes used to electrically connect the contact system of FIG. 1a to a printed circuit board.
Figure 1D:
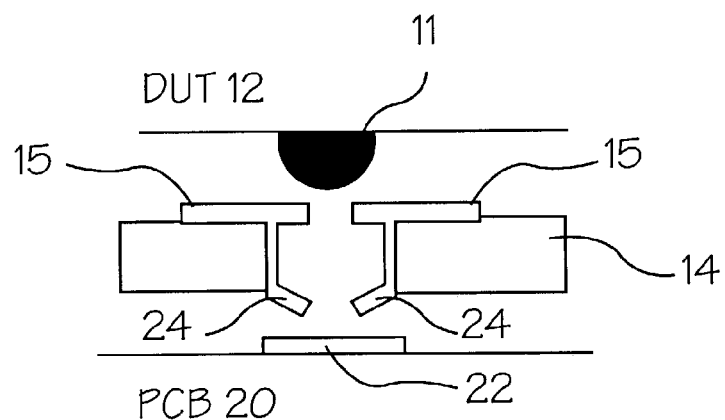
Figure 1E:
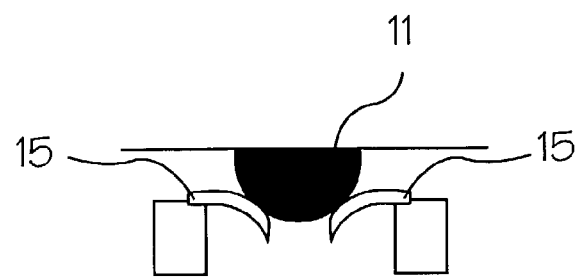
FIG. 1e shows a schematic of the structure for cradling a solder ball, in accordance with the invention depicted in FIGS. 1a and 1b.
Figure 1F:
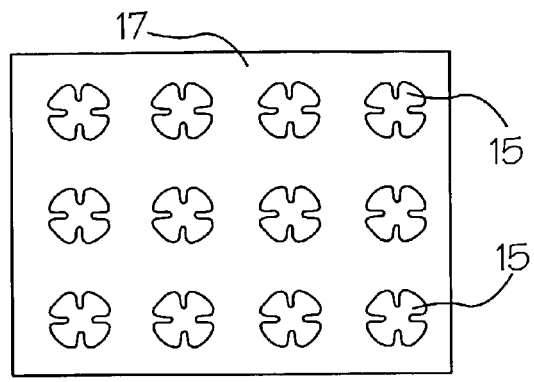

An array of contact arms 15 are fabricated upon layer 17, as better observed with reference to FIG. 1f. Different design patterns for the contact arms 15 are respectively illustrated by elements 15a, 15b, 15c, and 15d in FIG. 19.

Figure 1G:
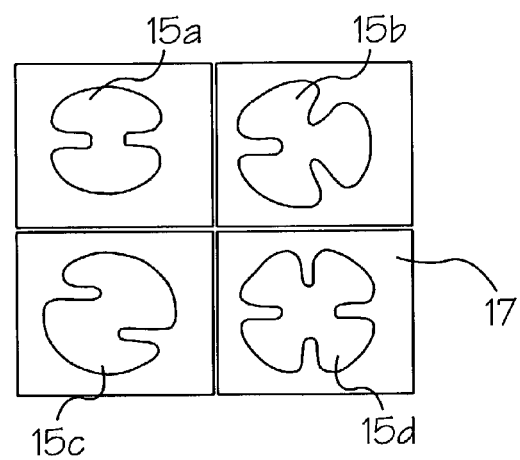
FIG. 1g depicts a plan view of several different contact arm designs.
Figure 1H:
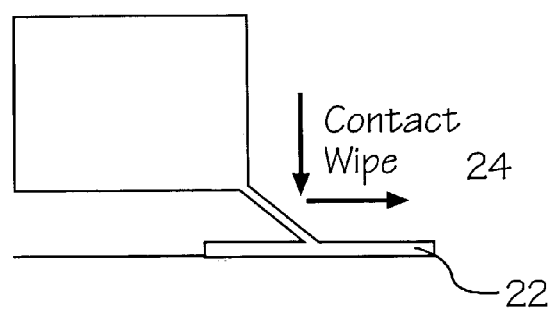
FIG. 1h shows an enlarged view of a contact wipe.

In FIG. 1b, the fabrication continues with the attachment of structure 10 to a pad 22 of a PCB 20 by means of electrical contact elements 24, which may consist of BLGA contact elements as better observed with reference to the enlarged view of FIG. 1h.

In FIG. 1c, the carrier or loadboard 14 is making electrical contact with a PCB 20 by means of a solder ball 11 that touches a pad 22.

In FIG. 1d, the loadboard 14 is again shown making contact with the pad 22 of the PCB 20 by means of BLGA contact wipers 24.

Elements 15 can be stamped or etched with the desired geometry. They are then assembled in a PCB-like fabrication process.

Figure 2:
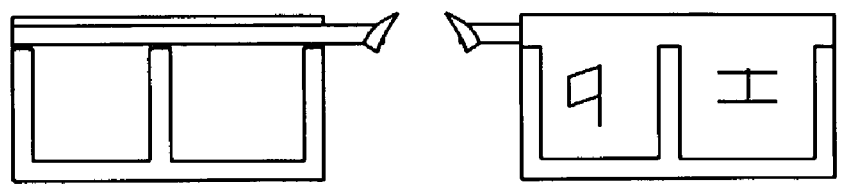
FIG. 2 illustrates a schematic of the contact element of FIG. 1a with internal circuitry and asperities.

Referring to FIG. 2, a BBGA contact element is schematically shown being incorporated into a conventional PCB stack up. Matched impedance capability can be used to provide improved performance for the electrical contact element by choosing the stacking design. Also, observe that asperities and additional circuitry may be added to improve wipe and electrical performance.

Figure 3A:
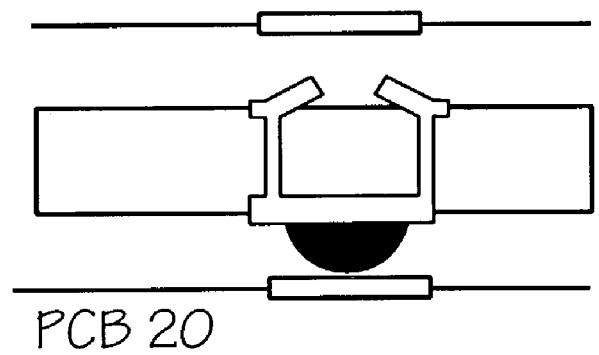
FIGS. 3a and 3b depict sectional views of a BLGA system of this invention, and its attachment to a PCB.

In FIG. 3a, a cross-sectional view of the BLGA electrical contact elements is shown. The BLGA system comprises a carrier layer 17 having an array of arms 15 that form elastic elements out of the plane of the carrier 17. The angle, thickness, and number of these elements can be readily changed to provide specific design features. The carrier 17 is making electrical contact with a PCB 20, by means of a solder ball 11 that touches a pad 22.

Figure 3B:
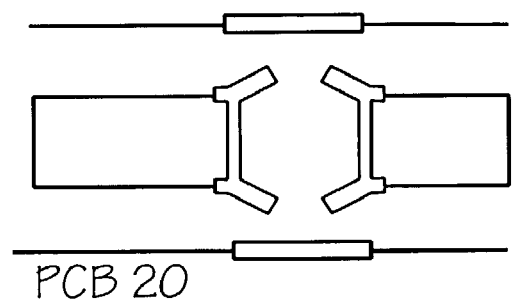

In FIG. 3b, the carrier 17 is again shown making contact with the pad 22 of the PCB 20 by means of BLGA contact wipers 24, similar to the contact arms at the top of the carrier 15.

Figure 3C:
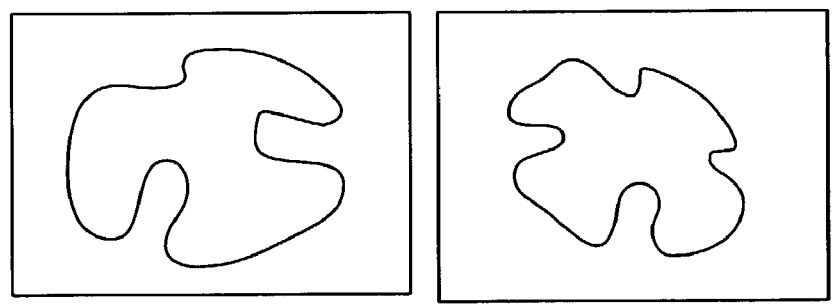
FIG. 3c depicts angled plan views of two example contact arm designs for the BLGA system of this invention.

FIG. 3c depicts angled plan views 15a and 15b of two example contact arm designs for the BLGA system of this invention.

Figure 4:
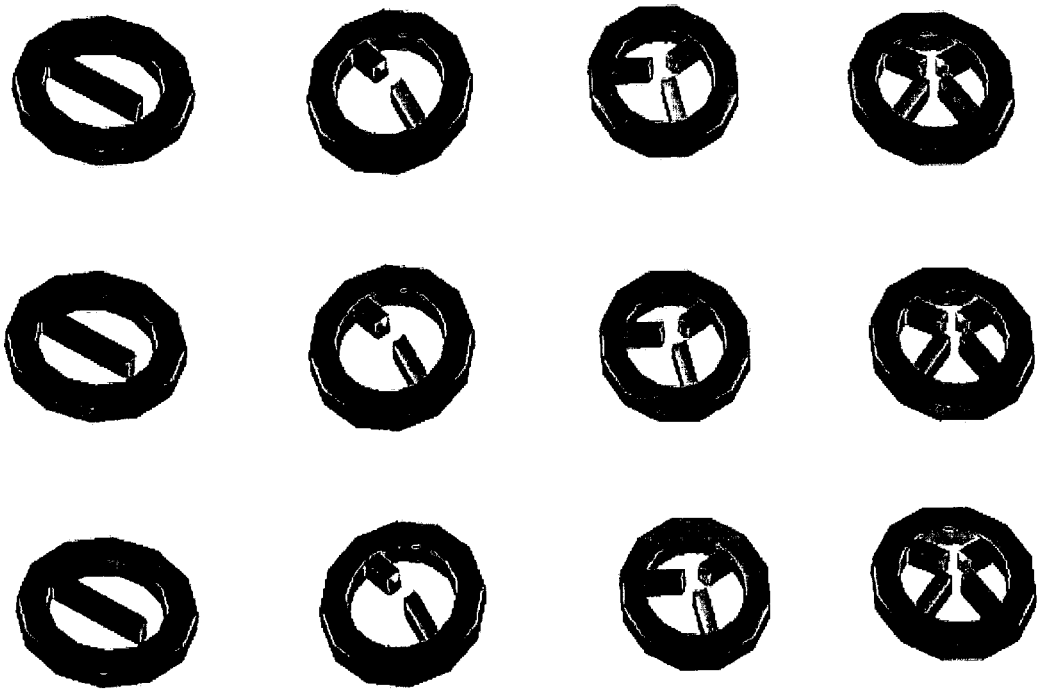
FIG. 4 shows an enlarged perspective view of different contact arm designs for contacting solder balls.

Referring to FIG. 4, a plurality of contact arm designs are shown for either a BBGA or a BLGA system. As aforementioned, these contacts are either stamped or etched into a spring-like structure, and can be heat treated before or after stamping. A typical material can comprise Be/Cu.

Figure 5A:
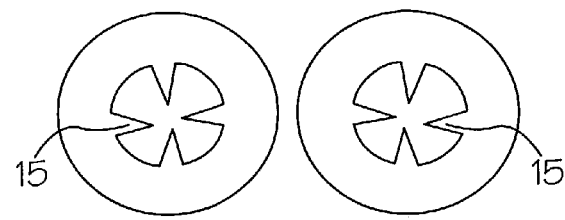
Figure 5B:
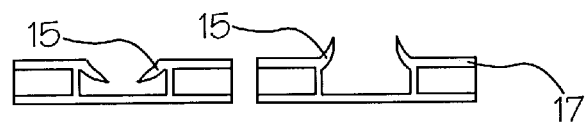

Referring to FIGS. 5a and 5b, enlarged top and side views of the contact elements 15 are illustrated. The contact elements 15 have the exact footprint of an electrical package or die I/O, for example.

Figure 5C:
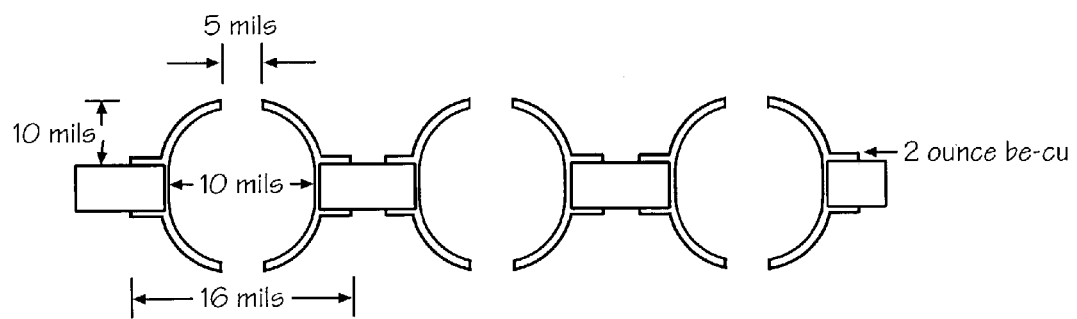
FIG. 5c depicts an enlarged sectional view of the contact arms for a BLGA contact array.

Referring to FIG. 5c, a sectional, enlarged view of the contact elements 15 for the BLGA system is shown. The elements can be etched into a sheet of beryllium-copper, for example.

Figure 6:
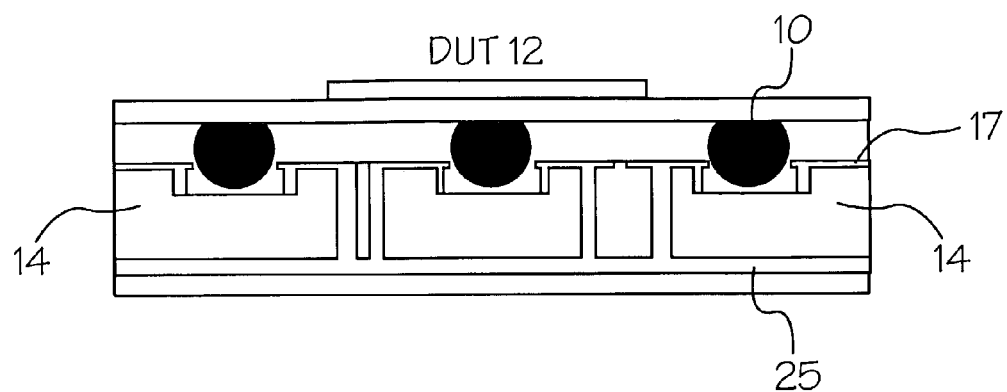
FIG. 6 shows a schematic sectional view of the contact system of FIG. 1a with a thermal plane disposed therein.

Referring to FIG. 6, the structure 10 of FIG. 1 is shown with internal heat dissipating layer 25 embedded into carrier layer 14.

Figure 7:
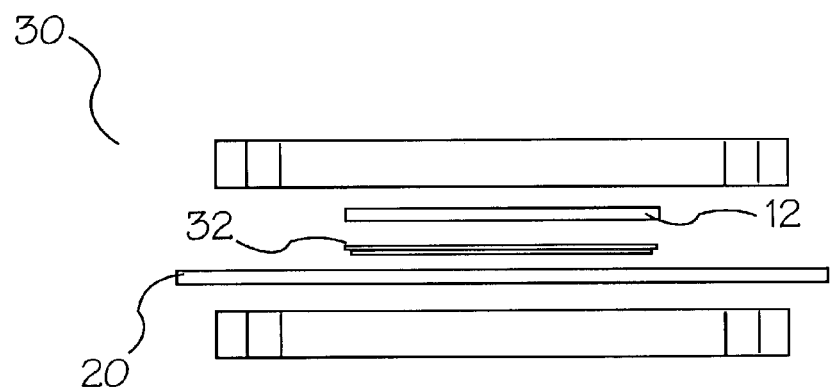
FIGS. 7 and 7a illustrate sectional and top views, respectively, of a clamping system for the contact systems of this invention.
Figure 7A:
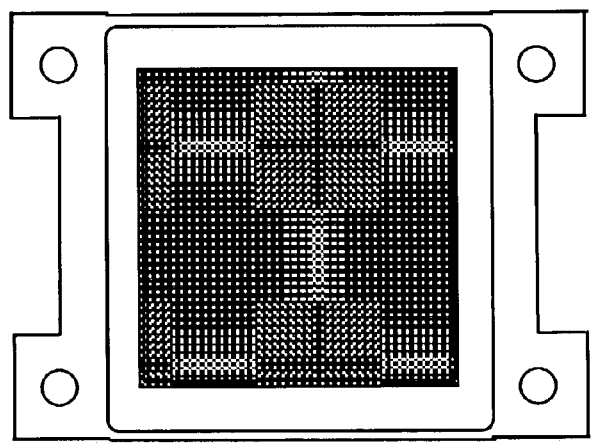

Referring to FIGS. 7 and 7a, a clamping mechanism 30 is shown in sectional and top views, respectively. The contact system of this invention (either a BBGA or BLGA) is depicted as an "interposer" 32, which is clamped between a PCB 20 and a package 12 that is to be attached by placing the assembly between a top plate 34 and a backing plate 36, which are screwed together or otherwise compressed together.

The contact system of this invention is fabricated in accordance with the following method steps comprising:

(a) forming a plurality or an array of contact elements in a metal or conductive sheet by etching, stamping, and using traditional PCB methods; and (b) attaching the sheet of step (a) to a substrate that comprises an electrical contact from one side to an opposite side. This can comprise standard printed circuit board substrate material, such as FR4, for example. The substrate should generally comprise an insulating material having conductive elements therethrough;

(c) a similar array of contact elements in a metal may also be attached to the opposite side of the sheet. Alternatively, solder balls or another standard contact approach may be used on one or both sides;

(d) unwanted metal can then be removed, by etching, for example;

(e) having formed the contact sheet of this invention, the sheet is then placed between two circuits, chips, boards, packages, or devices to be electrically connected together in the form of an interposer;

(f) the interposer is then clamped between the two outer devices.

The contact system of this invention can also be fabricated in accordance with the following method steps comprising:

(a) attaching a sheet of metal or other conductive sheet, to a substrate that comprises an electrical contact from one side to an opposite side. This can comprise standard printed circuit board substrate material, such as FR4, for example. The substrate should generally comprise an insulating material having conductive elements therethrough; and (b) forming a plurality or an array of contact elements in the metal, or conductive sheet by etching, stamping, and using traditional PCB methods;

(c) a similar array of contact elements in a metal may also be attached to the opposite side of the sheet. Alternatively, solder balls or another standard contact approach may be used on one or both sides;

(d) unwanted metal can then be removed, by etching, for example;

(e) having formed the contact sheet of this invention, the sheet is then placed between two circuits, chips, boards, packages, or devices to be electrically connected together in the form of an interposer;

(f) the interposer is then clamped between the two outer devices.

The contact system of this invention can be used with high frequency semiconductor devices or almost any type of electrical interface including, but not limited to: BGA, CSP, QFP, QFN, and TSOP packages.

Compared to stamped, formed, or coiled springs, the inventive contact system provides greater elasticity, without limiting electrical properties. The system is readily scalable to small pitch and small inductance, where pogo pins, and nano-springs are very limited in this regard.

Compared with polymer-based and dense metal systems, the inventive contact system of this invention is not limited in its mechanical properties, durability, contact force, and working range, while providing good electrical properties.

The contact system of this invention is characterized by its elastic functionality across the entire gap between the electrical devices to be connected, i.e., from device contact to device contact.

Figure 8:
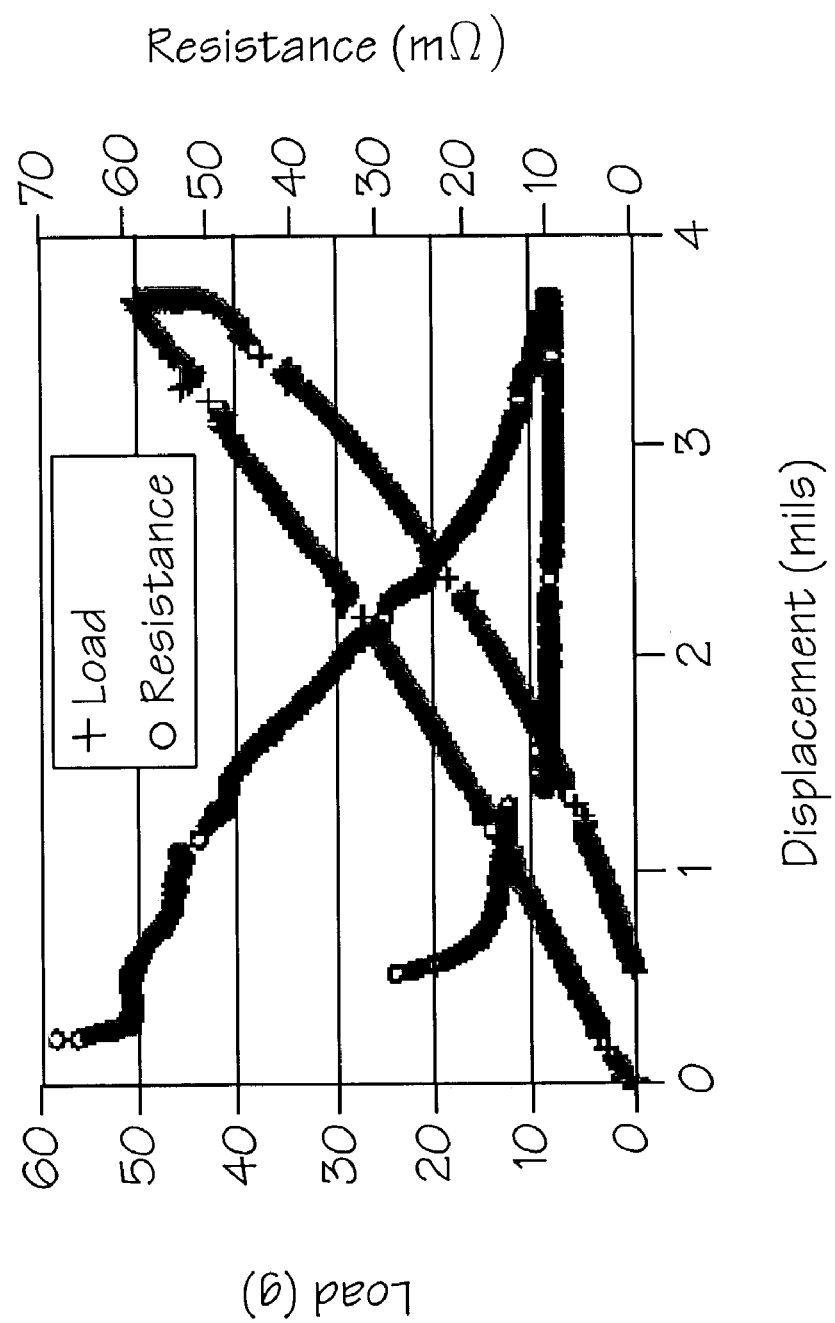
FIG. 8 depicts a graph of the load versus displacement for a BBGA system.

Referring to FIG. 8, a graph of load versus displacement for BBGA attachment systems of this invention is illustrated. It is easily observable that the invention displays operational characteristics beyond the range of present day contact devices.

Figure 9:
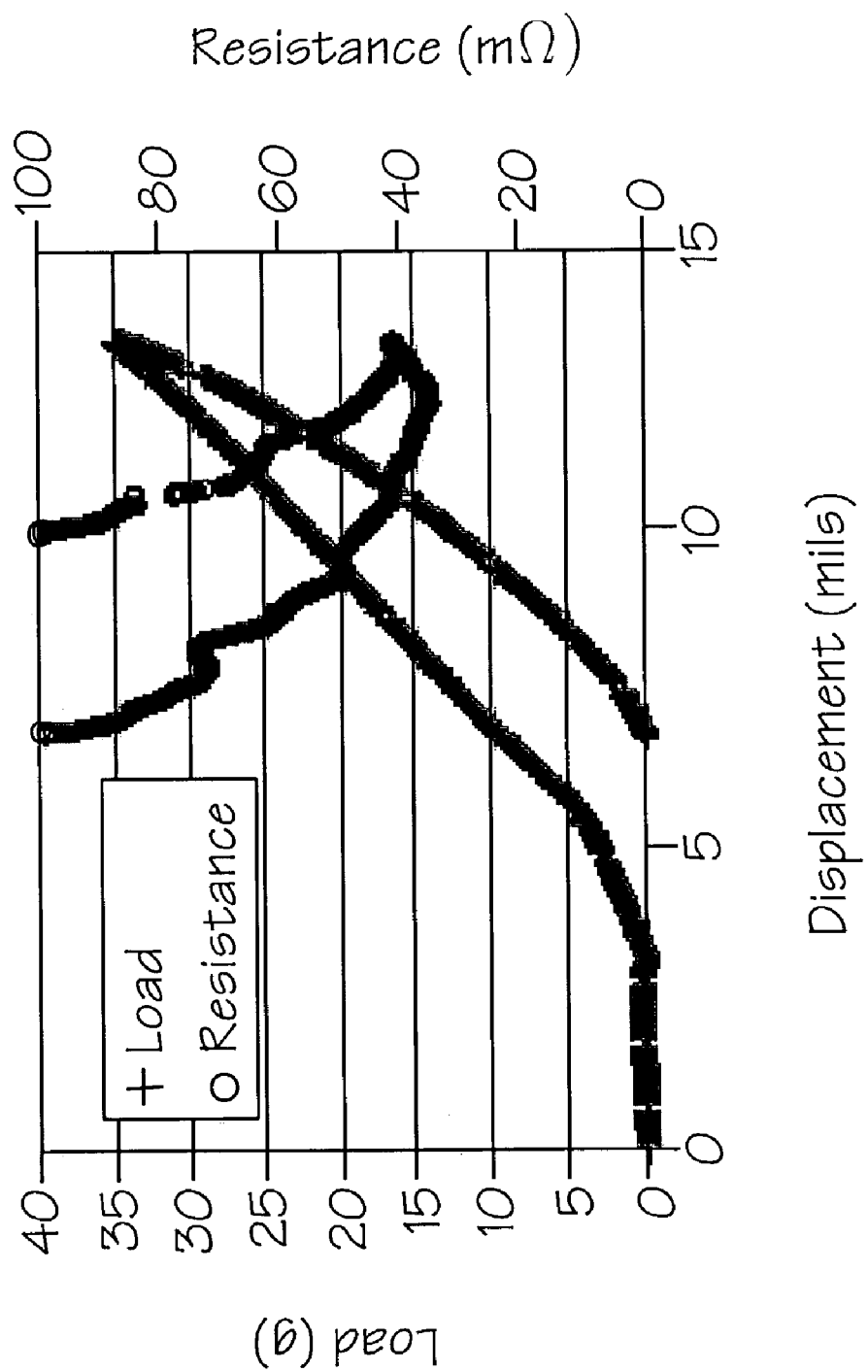
FIG. 9 shows a graph of the load versus displacement for a BLGA system of this invention.
Figure 10:
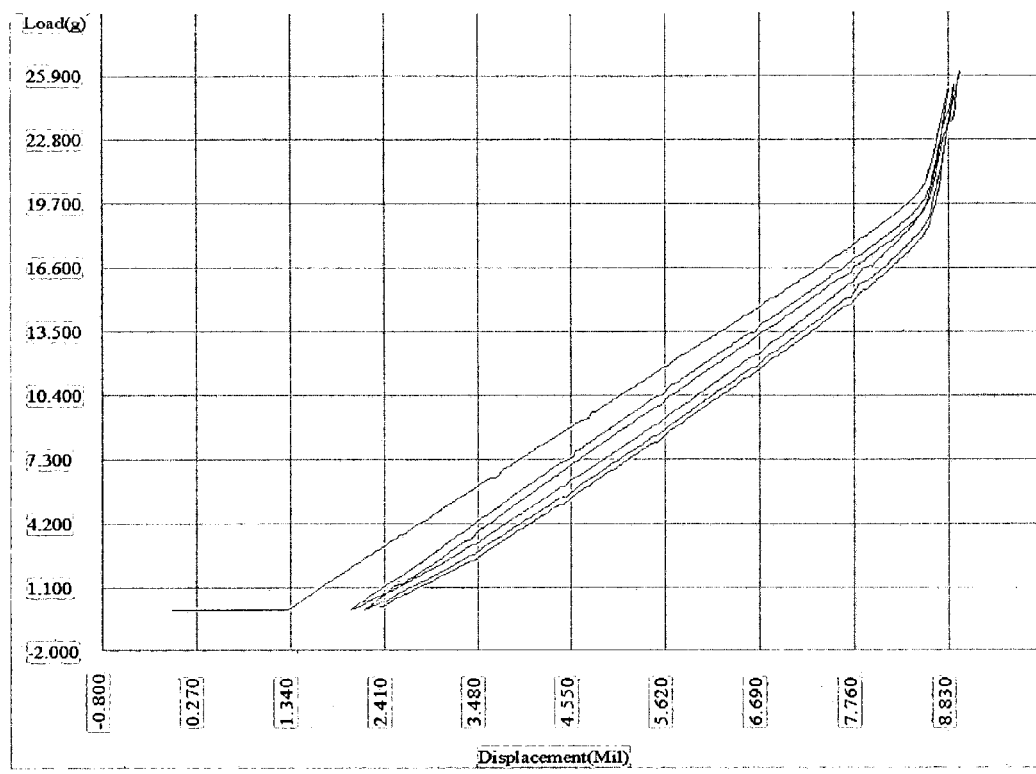
FIG. 10 shows a graph of the load versus displacement for a BLGA system of this invention.

Referring to FIG. 9, a graph of load versus displacement for BLGA attachment systems of this invention is illustrated. It is easily observable that the invention displays operational characteristics beyond the range of present day contact devices.

Typical mechanical and electrical characteristics for the contacts of this invention include: a large working range greater than 5 mils, a low contact force less than 30 g, wiping action for reliability, high durability greater than 200,000 cycles, high temperature operability greater than 125° C., good elasticity, low inductance less than 0.5 nH, high current capacity greater than 1.5 A, and a small scalable pitch less than 20 mils.

The connector elements and interposer layers of the present invention should be fabricated using the following guidelines:

Use of metal: (i) Cu, (ii) Cu-alloy, (iii) multiple metal layers to provide the best combination of mechanical and electrical properties; for example, a stainless steel layer for strong mechanical elasticity, a Cu layer for good conductivity, and an Au layer for low interface resistance and good corrosion resistance.

Use of dielectric material is (i) FR4, (ii) ceramic, or (iii) polymer.

Use of multiple, redundant metal flanges that are used to improve the electrical connection.

Use of metal flanges that have asperities to improve the electrical contact.

Use of metal flanges that are used on both sides or in which solder, conductive adhesive, or some other electrical contact method is used on one or both sides.

Use of additional metal planes or circuits that are included in the connector for thermal dissipation.

Use of additional metal planes or circuits that are included in the connector for electrical shielding, power delivery, addition of electronic components, or otherwise improving the electrical performance.

Using a pitch and height that are both approximately equal to or less than 1 mm.

Since other modifications and changes varied to fit particular operating requirements and environments will be apparent to those skilled in the art, the invention is not considered limited to the example chosen for purposes of disclosure and covers all changes and modifications which do not constitute departures from the true spirit and scope of this invention.

Having thus described the invention, what is desired to be protected by Letters Patent is presented in the subsequently appended claims.

What is claimed is:

1. An electrical contact interposer, comprising:
   an electrically insulating substrate having a through hole, wherein the through hole supports an electrically conducting contact element, the contact element comprising
   a first portion that extends along an inner wall of the through hole,
   a second portion that extends along a first surface of the substrate,
   a third portion that extends along a second surface of the substrate opposite the first surface,
   a fourth portion that extends away from the first surface and from an intersection of the first and second portions, toward a center area of the through hole,
   a fifth portion that extends away from the second surface and from an intersection of the first and third portions, toward a center area of the through hole,
   the first through the fifth portions having a unitary structure, and
   the first, fourth and fifth portions define a substantially continuous arc.

2. The interposer of claim 1, the contact element having a plurality of flexible arms disposed at the first surface of the substrate, the fourth portion comprising one flexible arm.

3. The interposer of claim 1, the contact element having two flexible arms disposed at the first surface of the substrate, the fourth portion comprising one flexible arm.

4. The interposer of claim 1, the contact element having three flexible arms disposed at the first surface of the substrate, the fourth portion comprising one flexible arm.

5. The interposer of claim 1, the contact element having four flexible arms disposed at the first surface of the substrate, the fourth portion comprising one flexible arm.

6. The interposer of claim 1, an elasticity-to-size ratio of said fourth portion being in an approximate range of between 0.5 and 1.0.

7. The interposer of claim 1, a pitch between contact elements of the interposer being 1 mm or less.

8. The interposer of claim 1, a pitch between contact elements of the interposer being less than approximately 20 mils.

9. The interposer of claim 1, said substrate comprising embedded thermal dissipation elements.

10. The interposer of claim 1, wherein when said interposer is clamped between electronic members having electrical contacts in registration with said through hole, said fourth portion is depressed to the insulating substrate no further than said first surface.

11. The interposer of claim 1, the unitary structure provided by a plated layer deposited in a single plating process.

* * * * *

UNITED STATES PATENT AND TRADEMARK OFFICE
CERTIFICATE OF CORRECTION

| | | |
|---|---|---|
| PATENT NO. | : 7,056,131 B1 | |
| APPLICATION NO. | : 10/412729 | |
| DATED | : June 6, 2006 | |
| INVENTOR(S) | : Williams | |

It is certified that error appears in the above-identified patent and that said Letters Patent is hereby corrected as shown below:

On the Title page, in Item (74), in "Attorney, Agent, or Firm", in column 2, line 1, delete "Michael," and insert -- Michael --, therefor.

On page 2, in Item (56), under "U.S. Patent Documents", in column 1, line 44, after "6,517,362" delete "B1" and insert -- B2 --, therefor.

On page 2, in Item (56), under "U.S. Patent Documents", in column 2, line 2, after "6,627,092" delete "B1" and insert -- B2 --, therefor.

On page 2, in Item (56), under "U.S. Patent Documents", in column 2, line 4, after "6,661,247" delete "B1" and insert -- B2 --, therefor.

On page 2, in Item (56), under "U.S. Patent Documents", in column 2, line 5, after "6,664,131" delete "B1" and insert -- B2 --, therefor.

In column 5, line 39, delete "Similary," and insert -- Similarly, --, therefor.

In column 9, line 9, delete "FIG. 19." and insert -- FIG. 1g. --, therefor.

Signed and Sealed this

Twelfth Day of June, 2007

JON W. DUDAS
*Director of the United States Patent and Trademark Office*